United States Patent
Chen et al.

(10) Patent No.: US 11,327,098 B2
(45) Date of Patent: May 10, 2022

(54) FREQUENCY DETECTION CIRCUIT AND METHOD

(71) Applicant: Grace Connection Microelectronics Limited, Zhubei (TW)

(72) Inventors: Pei Wei Chen, Zhubei (TW); Fang-Ren Liao, Zhubei (TW)

(73) Assignee: GRACE CONNECTION MICROELECTRONICS LIMITED, Zhubei (TW)

(*) Notice: Subject to any disclaimer, the term of this patent is extended or adjusted under 35 U.S.C. 154(b) by 17 days.

(21) Appl. No.: 17/087,648

(22) Filed: Nov. 3, 2020

(65) Prior Publication Data

US 2021/0141008 A1  May 13, 2021

(30) Foreign Application Priority Data

Nov. 7, 2019 (TW) ............... TW108140519

(51) Int. Cl.
*G01R 23/02* (2006.01)
*G01R 31/28* (2006.01)
*G01R 31/30* (2006.01)
*G01R 31/312* (2006.01)

(52) U.S. Cl.
CPC ......... *G01R 23/02* (2013.01); *G01R 31/2832* (2013.01); *G01R 31/3004* (2013.01); *G01R 31/312* (2013.01)

(58) Field of Classification Search
None
See application file for complete search history.

(56) References Cited

U.S. PATENT DOCUMENTS

| | | | |
|---|---|---|---|
| 6,753,738 B1* | 6/2004 | Baird | H03L 7/093 331/25 |
| 7,411,381 B2* | 8/2008 | Chang | H03H 7/0153 323/316 |
| 7,679,463 B2* | 3/2010 | Pernia | H03L 7/089 331/108 C |
| 10,386,882 B2* | 8/2019 | Kesarwani | H02M 3/158 |
| 2017/0264211 A1* | 9/2017 | Christiaans | G01R 19/0092 |

* cited by examiner

*Primary Examiner* — Jermele M Hollington
(74) *Attorney, Agent, or Firm* — TOMANAGEIP

(57) ABSTRACT

During frequency detection, a constant current source outputs an output current to charge a variable capacitor for multi-period. In a calibration mode, according to a comparison result between a cross voltage of the variable capacitor and a reference voltage, a capacitance value of the variable capacitor is adjusted. In a monitor mode, according to a reference frequency and the cross voltage of the variable capacitor, a frequency under test of a circuit under test is detected.

9 Claims, 3 Drawing Sheets

FREQUENCY DETECTION CIRCUIT AND METHOD

CROSS REFERENCE

THE present invention claims priority to TW 108140519, filed on Nov. 7, 2019.

BACKGROUND OF THE INVENTION

Field of Invention

The present invention relates to a frequency detection circuit and method, particularly a frequency detection circuit and method suitable for optical fiber transceivers that can detect the operation frequency of the circuit in real time and dynamically.

Description of Related Art

Digital data may be prone to noise easily during high-speed transmission. The transceiver usually needs a clock and data recovery circuit (CDR) to regenerate a low-jitter clock and recover low-noise data. Therefore, the clock and data recovery circuit (CDR) plays an important portion in the transmission and reception of data and clock signal.

Generally speaking, the clock signal generated by the clock and data recovery circuit is preferred to meet the requirements: 1. The clock frequency must be equal to the data transmission rate. 2. There must be a correct phase correspondence between the clock signal and data. 3. The clock signal can only have a small jitter.

However, the user usually does not know the operation frequency of the clock and data recovery circuit (CDR) when operating. If the operation frequency of the clock and data recovery circuit (CDR) can be detected in real time and dynamically, it helps a lot for operating the circuit device and subsequent operations.

SUMMARY OF THE INVENTION

In view of the above, the present invention provides a frequency detection circuit and method, which can detect an operation frequency of the circuit in real time and dynamically. According to one embodiment of the present invention, a frequency detection circuit is provided to detect a frequency under test of a circuit under test. The frequency detection circuit includes: an error amplifier for comparing a first reference voltage with a voltage at a node, and accordingly outputting a first comparison result; a current mirror, coupled to the error amplifier, and outputting a reference current according to the first comparison result, wherein the reference current is used to generate the voltage at the node, and the current mirror outputs an output current according to the reference current; a variable capacitor, coupled to the current mirror, the output current of the current mirror charging the variable capacitor; a comparator, coupled to the variable capacitor for comparing a second reference voltage with a cross voltage of the variable capacitor to generate a second comparison result; and a control circuit, coupled to the comparator and the variable capacitor, the control circuit outputting a control signal according to the second comparison result from the comparator, to control a capacitance value of the variable capacitor, the control circuit resetting the cross voltage of the variable capacitor, and receiving a reference frequency and the frequency under test of the circuit under test. In a calibration mode, the control circuit receives the reference frequency; and within a plurality of calibration periods, the output current of the current mirror charges the variable capacitor. At the ends of the calibration periods, the control circuit resets the cross voltage of the variable capacitor. At the end of each of the calibration periods, the control circuit controls the control signal according to the second comparison result output by the comparator, to control the capacitance value of the variable capacitor in the next calibration period. After the calibration mode, the control circuit determines a target capacitance value of the variable capacitor. Within a first monitor period in a monitor mode, the control circuit receives the reference frequency; and at the end of the first monitor period, the cross voltage of the variable capacitor is measured to be a first cross voltage. Within a second monitor period, the control circuit receives the frequency under test provided by the circuit under test; and at the end of the second monitor period, the cross voltage of the variable capacitor is measured to be a second cross voltage, and the control circuit determines the frequency under test according to the reference frequency, the first cross voltage and the second cross voltage.

According to another embodiment of the present invention, a frequency detection method is provided to detect the frequency under test of the circuit under test. The frequency detection method includes: comparing a first reference voltage with a voltage at the node, and outputting a first comparison result; outputting a reference current according to the first comparison result, wherein the voltage of the node is generated according to the reference current, and an output current is output according to the reference current; charging the variable capacitor with the output current; comparing a second reference voltage with a cross voltage of the variable capacitor, to generate a second comparison result; and outputting a control signal according to the second comparison result, to control a capacitance value of the variable capacitor, to reset the cross voltage of the variable capacitor. In a calibration mode, receiving a reference frequency within a plurality of calibration periods, the output current charging the variable capacitor. At the end of each of the calibration periods, resetting the cross voltage of the variable capacitor. At the ends of the calibration periods, the control signal is controlled according to the second comparison result, to control the capacitance value of the variable capacitor in the next calibration period. After the calibration mode, a target capacitance value of the variable capacitor is determined. In a monitor mode, within a first monitor period, receiving the reference frequency. At the end of the first monitor period, measuring the cross voltage of the variable capacitor to be a first cross voltage. Within a second monitor period, receiving the frequency under test provided by the circuit under test; and at the end of the second monitor period, measuring the cross voltage of the variable capacitor to be a second cross voltage. The frequency under test is determined according to the reference frequency, the first cross voltage and the second cross voltage The objectives, technical details, features, and effects of the present invention will be better understood with regard to the detailed description of the embodiments below, with reference to the attached drawings.

DESCRIPTION OF THE PREFERRED EMBODIMENTS

Technical terms in this specification refer to the usual term explanations in the technical field. When this specification describes or defines these terms, the definitions of these terms are subject to the description or definition in this specification. Each embodiment of the present invention has one or more technical features. Under the premise of possible implementation, those skilled in the art can selectively implement some or all of the technical features in any embodiment, or selectively combine some or all of the technical features in these embodiments.

Figure 1:
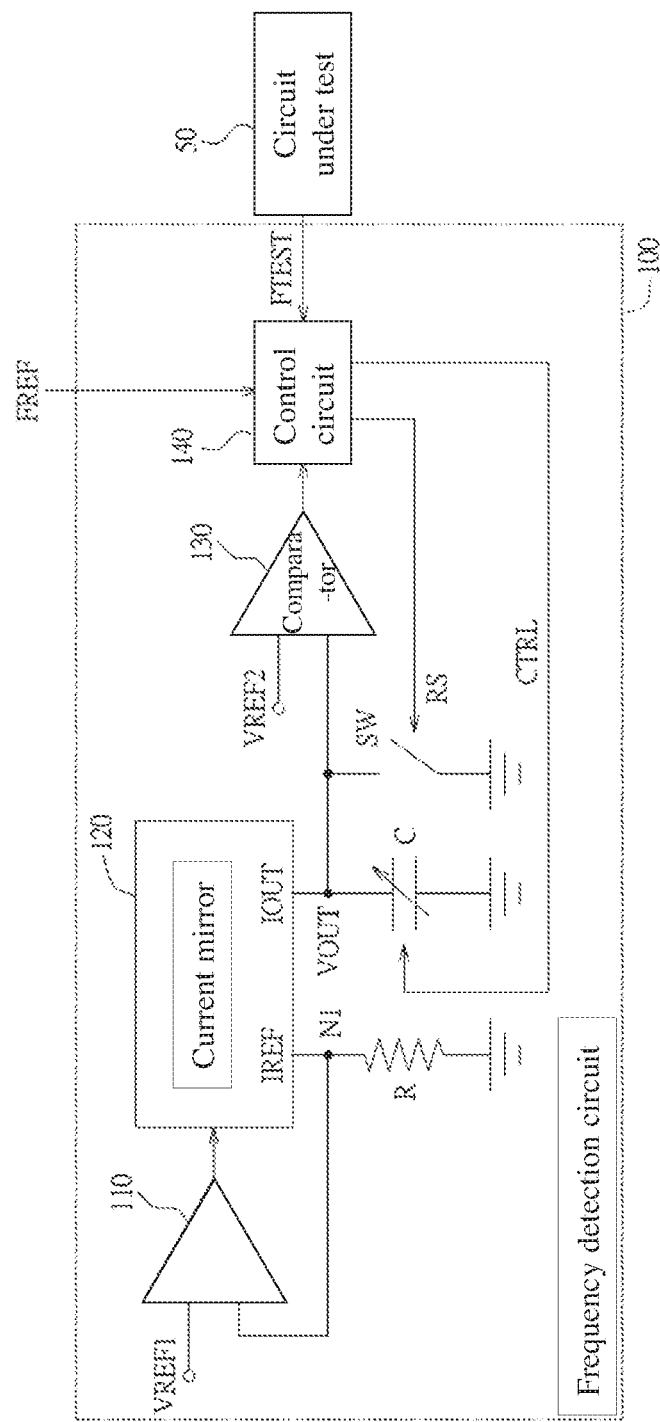
FIG. 1 shows a functional block diagram of a frequency detection circuit according to one embodiment of the present invention.

FIG. 1 shows a functional block diagram of a frequency detection circuit according to one embodiment of the present application. The frequency detection circuit 100 can be configured to detect the operation frequency of the circuit under test 50. The circuit under test 50 may be but not limited to, for example, a clock and data recovery circuit (CDR).

The frequency detection circuit 100 includes: an error amplifier (EA) 110, a current mirror 120, a resistor R, a variable capacitor C, a comparator 130, a control circuit 140 and a switch SW.

The error amplifier 110 can be configured to compare the first reference voltage VREF1 with the voltage of the node N1, wherein the voltage of the node N1 can be VN1=IREF*R, wherein IREF is the reference current output by the current mirror 120, and R is the resistance value of the resistor R (a predetermined value). The comparison result from the error amplifier 110 (referred to as "first comparison result" hereinafter) can be input to the current mirror 120 to adjust the reference current IREF output from the current mirror 120; that is, adjusting the voltage VN1 of node N1. By the error amplifier 110, the voltage VN1 of the node N1 can be close to the first reference voltage VREF1, wherein VN1≈VREF1=IREF*R. Therefore, when the voltage VN1 of the node N1 is close to the first reference voltage VREF1, the reference current IREF output by the current mirror 120 can be expressed as: IREF=VREF1/R.

The current mirror 120 can be coupled to the error amplifier 110 and the resistor R. As mentioned above, when the voltage VN1 of the node N1 is close to the first reference voltage VREF1, the reference current IREF output by the current mirror 120 can be expressed as: IREF=VREF1/R. The current mirror 120 also outputs an output current IOUT, and the output current IOUT can be expressed as: IOUT=M*IREF, wherein the parameter M is the current amplification gain of the current mirror 120. The circuit schematic layout of the current mirror 120 can be not limited hereto; for example, the current mirror 120 can also be a constant current source.

The resistor R is coupled to the error amplifier 110 and the current mirror 120, and the reference current IREF flows through the resistor R. The cross voltage of the resistor R is the voltage VN1 of the node N1.

The variable capacitor C can be coupled to the current mirror 120. The variable capacitor C can be a capacitor matrix. During a charging period, the output current IOUT of the current mirror 120 can charge the variable capacitor C to increase the cross voltage VOUT of the variable capacitor C. When the charging period is longer, the cross voltage VOUT of the variable capacitor C is higher. When the charging period is shorter, the cross voltage VOUT of the variable capacitor C is lower. In addition, when the capacitance of the variable capacitor C is larger, the cross voltage VOUT of the variable capacitor C rises/falls slowly. When the capacitance of the variable capacitor C is lower, the cross voltage VOUT of the variable capacitor C rises/falls quickly. In this embodiment, the cross voltage VOUT of the variable capacitor C can be obtained by measuring.

The comparator 130 is coupled to a variable capacitor C. The comparator 130 compares the second reference voltage VREF2 with the cross voltage VOUT of the variable capacitor C to generate a second comparison result. The second comparison result from the comparator 130 is input to the control circuit 140.

The control circuit 140 is coupled to the comparator 130 and the variable capacitor C. The control circuit 140 outputs a control signal CTRL according to the output signal of the comparator 130 (the second comparison result), to control the capacitance value of the variable capacitor C. Besides, the control circuit 140 may output a reset signal RS to the switch SW, to reset the cross voltage VOUT of the variable capacitor C. The control circuit 140 receives the reference frequency FREF and the frequency under test FTEST. The switch SW is coupled to the variable capacitor C and the control circuit 140.

Taking the control signal CTRL is 4 bits as an example, and this case is not to limit the scope of the present invention. The capacitance value of variable capacitor C can be expressed as: C=CTRL*Cunit, wherein Cunit means unit capacitance. When the control signal CTRL is [1111], the capacitance value of the variable capacitor C has the maximum value; when the control signal CTRL is [0000], the variable capacitor C has the minimum capacitance value. The rest detail between the control signal CTRL and the capacitance value of the variable capacitor C can be obtained in a similar manner. Therefore, when the control signal CTRL increases, the capacitance value of the variable capacitor C increases; and when the control signal CTRL decreases, the capacitance value of the variable capacitor C decreases.

The switch SW is controlled by the control circuit 140. When the control circuit 140 outputs the reset signal RS to the switch SW, the switch SW is turned on to discharge the voltage stored in the variable capacitor C (that is, the cross voltage VOUT of the variable capacitor C is reset).

Figure 2:
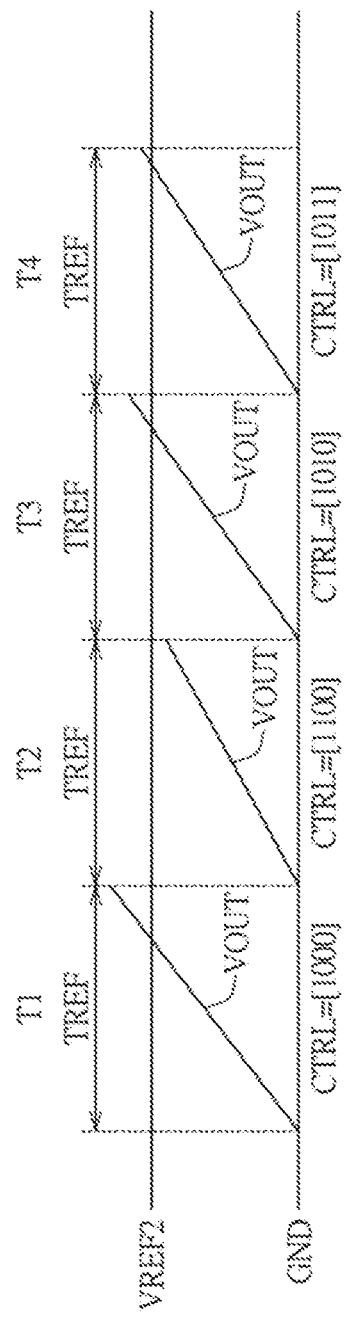
FIG. 2 shows a waveform diagram of the frequency detection circuit operating in the calibration mode according to one embodiment of the present invention.

FIG. 2 shows a waveform diagram of the frequency detection circuit operating in a calibration mode according to one embodiment of the present invention. The length of each of periods T1-T4 (also named as calibration period T1-T4) is TREF=N/FREF (N is a positive integer), wherein FREF is the reference frequency. The reference frequency FREF can be provided by the circuit under test 50 or any other external reference signal source under test (not shown).

As shown in FIG. 2, in the first period T1, setting the control signal CTRL to [1000]. During the charging period TREF, the output current IOUT of the current mirror 120 charges the variable capacitor C, so that the cross voltage VOUT of the variable capacitor C rises. At the end of the charging period TREF, the control circuit 140 outputs a reset signal RS to the switch SW to reset the cross voltage VOUT of the variable capacitor C. At the end of the first period T1, the control circuit 140 can output a control signal CTRL to the variable capacitor C according to the comparison result from the comparator 130, to control the capacitance value of the variable capacitor C in the next period T2. That is, if the cross voltage VOUT of the variable capacitor C is higher than the second reference voltage VREF2 at the end of the first period T1, the capacitance value of variable capacitor C is lower. Therefore, in the next period, the control circuit 140 increases the value of the control signal CTRL (for example, from [1000] to [1100]) to increase the capacitance value of the variable capacitor C. Importantly, the present invention can increase (or decrease) the bit number of the control signal CTRL depending on the accuracy requirements. Conversely, when at the end of the first period T1, the cross voltage VOUT of the variable capacitor C is lower than the second reference voltage VREF2, the variable capacitor C has a higher capacitance value. Therefore, in the next period, the control circuit 140 reduces the value of the control signal CTRL (for example, from [1000] to [0111]) to reduce the capacitance value of the variable capacitor C.

Taking FIG. 2 as an example, after the first period T1, the cross voltage VOUT of the variable capacitor C is higher than the second reference voltage VREF2 (the variable capacitor C has a lower capacitance value). In the next period T2, the control circuit 140 increases the value of the control signal CTRL (from [1000] to [1100]) to increase the capacitance of the capacitance value of the variable capacitor C.

Please refer to FIG. 2 again, after the second period T2, the cross voltage VOUT of the variable capacitor C is lower than the second reference voltage VREF2 (the variable capacitor C has a higher capacitance value). In the next period T3, the control circuit 140 reduces the value of the control signal CTRL (from [1100] to [1010]) to reduce the capacitance value of the variable capacitor C.

A shown in FIG. 2, after the third period T3, the cross voltage VOUT of the variable capacitor C is higher than the second reference voltage VREF2 (the variable capacitor C has a lower capacitance value). In the next period T4, the control circuit 140 reduces the value of the control signal CTRL (from [1010] to [1011]), to reduce the capacitance value of the variable capacitor C.

After 4 periods, the cross voltage VOUT of the variable capacitor C is gradually closer to the second reference voltage VREF2, it shows that the capacitance value of the variable capacitor C is close to a target value CREF, wherein VOUT=(IOUT*TREF)/CREF, therefore, CREF=(IOUT*TREF)/VOUT.

That is, in the calibration mode, the target capacitance value of the variable capacitor C can be determined (that is, determining the value of the control signal CTRL). After determining the target capacitance value of the variable capacitor C, the frequency detection circuit can enter the monitor mode from the calibration mode. In the monitor mode, the capacitance value of the variable capacitor C is equal to the capacitance value of the variable capacitor within the last period in the calibration mode. In one embodiment, the present invention can optionally perform more rounds of the aforementioned four-period measurements as required.

Figure 3:
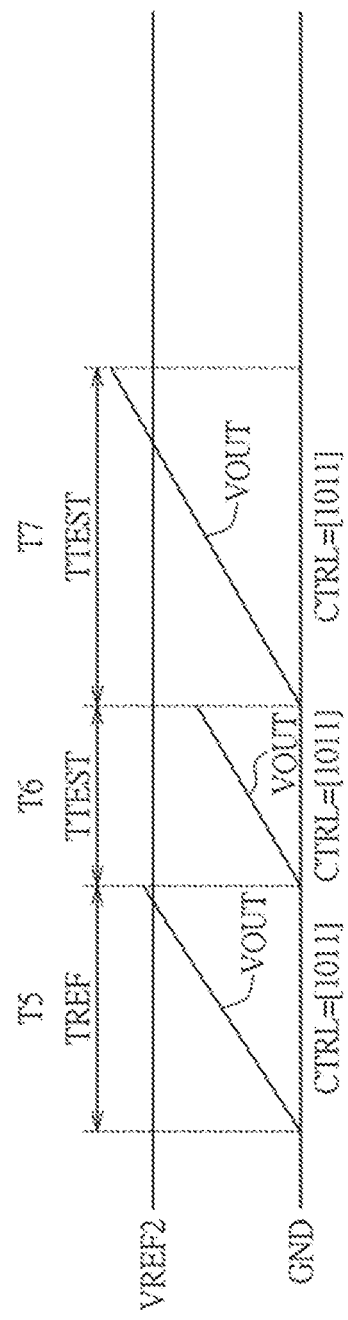
FIG. 3 shows a waveform diagram of the frequency detection circuit operating in the monitor mode according to one embodiment of the present invention.

FIG. 3 shows a waveform diagram of the frequency detection circuit operating in the monitor mode according to one embodiment of the present invention. Please refer to FIG. 3, in the period T5 (period T5 can also be named as the first monitor period), wherein the control circuit 140 receives the reference frequency FREF, to control the length TREF of the control period T5, wherein TREF=N/FREF (N is a positive integer). After the period T5, measuring the cross voltage VOUT of the variable capacitor C (the value noted as VOUT_REF, hereinafter referred to as a first cross voltage), and resetting it.

During the period T6 (period T6 also named as the second monitor period), the control circuit 140 receives the frequency under test FTEST provided by the circuit under test 50, to control the control period T6 with a length TTEST=N/FTEST (N is a positive integer). After the period T6, measuring the cross voltage VOUT of the variable capacitor C (the value noted as VOUT_TEST, hereinafter referred to as a second cross voltage), and resetting it.

In the monitor mode, since the capacitance value of the variable capacitor C is fixed and known, and the output current IOUT of the current mirror 120 is also fixed and known. Therefore, the cross voltage VOUT of the variable capacitor C is proportional to the period length, that is, VOUT_TEST/VOUT_REF=TTEST/TREF, Since TREF=N/FREF and TTEST=N/FTEST, which can deduce that VOUT_TEST/VOUT_REF=FREF/FTEST. Therefore, the frequency under test FTEST can be: FTEST=FREF/(VOUT_TEST/VOUT_REF), wherein the frequency under test FTEST is the operation frequency of the circuit under test 50.

As shown in FIG. 3, in the monitor mode, if necessary, the operating frequency of another circuit under test 50 can be monitored immediately (for example, as indicated in the period T7).

According to the aforementioned embodiments of the present invention, in the calibration mode, the capacitance value of the variable capacitor C is determined. In the monitor mode, the operation frequency of the circuit under test 50 can be detected.

Figure 4:
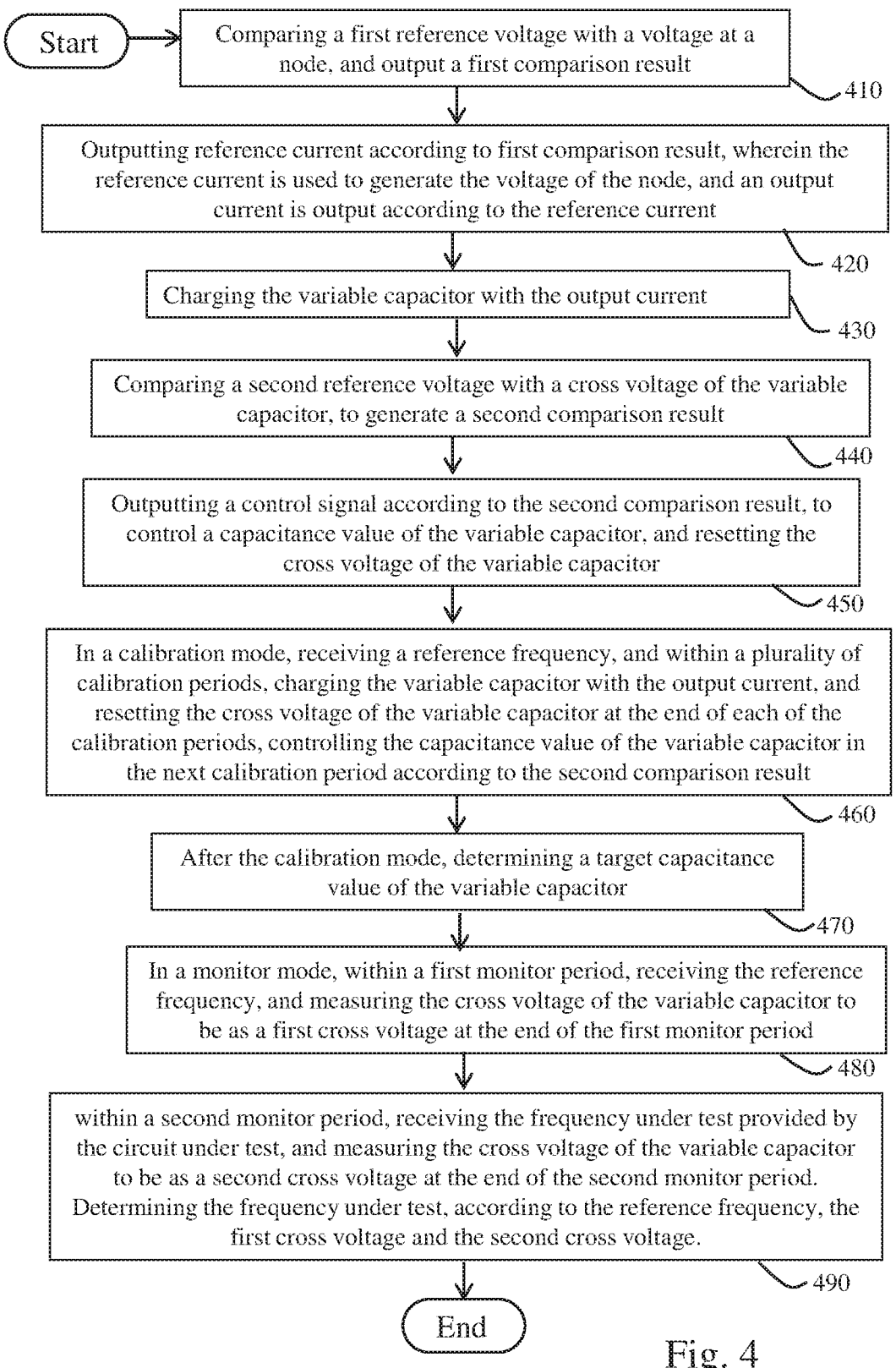
FIG. 4 shows a flow chart of the frequency detection method according to one embodiment of the present invention.

FIG. 4 shows a flowchart of a frequency detection method according to one embodiment of the present invention. In step 410, comparing a first reference voltage with a voltage at a node, and output a first comparison result. In step 420, a reference current is output according to the first comparison result, wherein the reference current is used to generate the voltage of the node, and an output current is output according to the reference current. In step 430, charging the variable capacitor with the output current. In step 440, comparing a second reference voltage with a cross voltage of the variable capacitor, to generate a second comparison result. In step 450, outputting a control signal according to the second comparison result, to control a capacitance value of the variable capacitor, and resetting the cross voltage of the variable capacitor. In step 460, in a calibration mode, receiving a reference frequency, and within a plurality of calibration periods, charging the variable capacitor with the output current, and resetting the cross voltage of the variable capacitor at the end of each of the calibration periods, controlling the capacitance value of the variable capacitor in the next calibration period according to the second comparison result. In step 470, after the calibration mode, determining a target capacitance value of the variable capacitor. In step 480, in a monitor mode, within a first monitor period, receiving the reference frequency, and measuring the cross voltage of the variable capacitor to be as the first cross voltage at the end of the first monitor period. In step 490, within a second monitor period, receiving the frequency under test provided by the circuit under test, and measuring the cross voltage of the variable capacitor to be as the second cross voltage at the end of the second monitor period.

Determining the frequency under test, according to the reference frequency, the first cross voltage and the second cross voltage.

In one embodiment, the first reference voltage VREF1 and the second reference voltage VREF2 may have a voltage division relationship.

The embodiment of the present invention discloses a frequency detection circuit and method that can automatically sense the operation frequency of the circuit, which is especially suitable for fiber optic transceivers and other devices that need to detect the operation frequency of the circuit. The embodiment of the present invention uses a principle that the current multiplied by the charging time is equal to the capacitor voltage, and the variable capacitor is charged and discharged in multiple periods, and the operation frequency of the circuit under test is obtained according to the preset specific conditions.

The present invention has been described in considerable detail with reference to certain preferred embodiments thereof. It should be understood that the description is for illustrative purpose, not for limiting the scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention.

What is claimed is:

1. A frequency detection circuit, for detecting a frequency under test of a circuit under test, the frequency detection circuit comprising:
    an error amplifier, comparing a first reference voltage and a voltage at a node, and accordingly outputting a first comparison result;
    a current mirror, coupled to the error amplifier, and outputting a reference current according to the first comparison result to, wherein the voltage of the node is generated according to the reference current, and the current mirror generates an output current according to the reference current;
    a variable capacitor, coupled to the current mirror, and the output current of the current mirror charges the variable capacitor;
    a comparator, coupled to the variable capacitor for comparing a second reference voltage with a cross voltage of the variable capacitor, to generate a second comparison result; and
    a control circuit, coupled to the comparator and the variable capacitor, the control circuit outputting a control signal according to the second comparison result from the comparator, to control a capacitance value of the variable capacitor, the control circuit resetting the cross voltage of the variable capacitor, and receiving a reference frequency and a frequency under test of the circuit under test;
    wherein, in a calibration mode, the control circuit receives the reference frequency, and the output current of the current mirror charges the variable capacitor within a plurality of calibration periods, wherein at the end of each of the calibration periods, the control circuit resets the cross voltage of the variable capacitor, and controls the control signal according to the second comparison result from the comparator, to control the capacitance value of the variable capacitor in the next calibration period;
    after the calibration mode, the control circuit determines a target capacitance value of the variable capacitor;
    in a monitor mode, the control circuit receives the reference frequency within a first monitor period, and a first cross voltage is measured according to the cross voltage of the variable capacitor at the end of the first monitor period; and
    the control circuit receives the frequency under test provided by the circuit under test within a second monitor period in the monitor mode, wherein at the end of the second monitor period, a second cross voltage is determined by measuring the cross voltage of the variable capacitor, and the control circuit determines the frequency under test according to the reference frequency, the first cross voltage, and the second cross voltage.

2. The frequency detection circuit of claim 1, further comprising:
    a resistor, coupled to the current mirror, the reference current flowing through the resistor, and a cross voltage on the resistor corresponding to the voltage of the node; and
    a switch, coupled to the variable capacitor and the control circuit, wherein at the end of each of the calibration periods, the control circuit outputs a reset signal to the switch to reset the cross voltage of the variable capacitor.

3. The frequency detection circuit of claim 1, wherein in the calibration mode,
    at the end of each of the calibration periods, when the cross voltage of the variable capacitor is higher than the second reference voltage, the control circuit increases the control signal to increase the capacitance value of the variable capacitor in the next calibration period; and
    at the end of each of the calibration periods, when the cross voltage of the variable capacitor is lower than the second reference voltage, the control circuit reduces the control the signal to reduce the capacitance value of the variable capacitor in the next calibration period.

4. The frequency detection circuit of claim 1, wherein there is a voltage division relationship between the first reference voltage and the second reference voltage.

5. The frequency detection circuit of claim 1, wherein the reference frequency is provided by the circuit under test or an external reference signal source.

6. A frequency detection method for detecting a frequency under test of a circuit under test, comprising:
    comparing a first reference voltage with a voltage at a node, and outputting a first comparison result;
    outputting a reference current according to the first comparison result, wherein the voltage of the node is generated according to the reference current, and an output current is output according to the reference current;
    charging the variable capacitor with the output current;
    comparing a second reference voltage with a cross voltage of the variable capacitor, to generate a second comparison result; and
    outputting a control signal according to the second comparison result, to control a capacitance value of the variable capacitor, and resetting the cross voltage of the variable capacitor;
    wherein,
    in a calibration mode, receiving a reference frequency, the output current charging the variable capacitor within a plurality of calibration periods, resetting the cross voltage of the variable capacitor at the end of the calibration period, and controlling the control signal according to the second comparison result to control the capacitance value of the variable capacitor in the next calibration period at the end of the calibration period;

after the calibration mode, determining a target capacitance value of the variable capacitor;

within a first monitor period in a monitor mode, receiving the reference frequency, and at the end of the first monitor period, determining a first cross voltage by measuring the cross voltage of the variable capacitor; and within a second monitor period in the monitor mode, receiving the frequency under test provided by the circuit under test, determining a second cross voltage by measuring the cross voltage of the variable capacitor at the end of the second monitor period, determining the frequency under test according to the reference frequency, the first cross voltage and the second cross voltage.

7. The frequency detection method of claim 6, wherein in the calibration mode,
- at the end of each of the calibration periods, when the cross voltage of the variable capacitor is higher than the second reference voltage, increasing the control signal to increase the capacitance value of the variable capacitor in the next calibration period; and
- at the end of each of the calibration periods, when the cross voltage of the variable capacitor is lower than the second reference voltage, reducing the control signal to lower the capacitance value of the variable capacitor in the next calibration period.

8. The frequency detection method of claim 6, wherein there is a voltage division relationship between the first reference voltage and the second reference voltage.

9. The frequency detection method of claim 6, wherein the reference frequency is provided by the circuit under test; or, the reference frequency is provided by an external reference signal source.

* * * * *